(12) United States Patent
Takatani et al.

(10) Patent No.: US 9,070,685 B2
(45) Date of Patent: Jun. 30, 2015

(54) COMPOUND SEMICONDUCTOR INTEGRATED CIRCUIT

(75) Inventors: Shinichiro Takatani, Tao Yuan Shien (TW); Hsien-Fu Hsiao, Tao Yuan Shien (TW); Yu-Kai Wu, Tao Yuan Shien (TW)

(73) Assignee: WIN SEMICONDUCTORS CORP., Kuei Shan Hsiang, Tao Yuan Shien (TW)

( * ) Notice: Subject to any disclaimer, the term of this patent is extended or adjusted under 35 U.S.C. 154(b) by 250 days.

(21) Appl. No.: 13/594,557

(22) Filed: Aug. 24, 2012

(65) Prior Publication Data
US 2014/0054608 A1    Feb. 27, 2014

(51) Int. Cl.
*H01L 23/52*     (2006.01)
*H01L 23/522*    (2006.01)
*H01L 23/532*    (2006.01)
*H01L 23/48*     (2006.01)
*H01L 23/528*    (2006.01)

(52) U.S. Cl.
CPC .......... *H01L 23/5223* (2013.01); *H01L 23/481* (2013.01); *H01L 23/5227* (2013.01); *H01L 23/528* (2013.01); *H01L 23/53228* (2013.01); *H01L 23/53252* (2013.01); *H01L 23/5329* (2013.01); *H01L 2924/0002* (2013.01)

(58) Field of Classification Search
USPC .............. 257/76, 77, 197, E29.002, E29.089, 257/207, 208, 211, 774
See application file for complete search history.

(56) References Cited

U.S. PATENT DOCUMENTS

| | | | |
|---|---|---|---|
| 8,232,639 B2 * | 7/2012 | Kobayashi et al. | ........... 257/736 |
| 8,592,825 B2 * | 11/2013 | Yamaki | ............................ 257/77 |
| 2012/0208331 A1 * | 8/2012 | Kikkawa | ........................ 438/172 |
| 2012/0248599 A1 * | 10/2012 | Ring | ............................. 257/737 |
| 2013/0134596 A1 * | 5/2013 | Hu et al. | ....................... 257/773 |

\* cited by examiner

*Primary Examiner* — Tan N Tran
(74) *Attorney, Agent, or Firm* — Muncy, Geissler, Olds & Lowe, P.C.

(57) ABSTRACT

A compound semiconductor integrated circuit is provided, comprising a substrate, at least one compound semiconductor electronic device, a first metal layer, a protection layer, a plurality of second metal layers, and at least one dielectric layer. The first metal layer contains Au but does not contain Cu, and is at least partly electrically connected to the compound semiconductor electronic device. The protection layer covers the compound semiconductor electronic device and at least part of the first metal layer. Each of the plurality of second metal layers contains at least a Cu layer, and at least one of the plurality of second metal layers is partly electrically connected to the first metal layer described above. The at least one dielectric layer separates each pair of adjacent second metal layers. The second metal layers are used to form passive electronic components.

17 Claims, 5 Drawing Sheets

COMPOUND SEMICONDUCTOR INTEGRATED CIRCUIT

FIELD OF THE INVENTION

The present invention relates to a compound semiconductor integrated circuit, and more particularly to a compound semiconductor integrated circuit with multiple metal layers, each of which consists at least a Cu layer.

BACKGROUND OF THE INVENTION

Compound semiconductor monolithic microwave integrated circuits (MMICs) have been widely applied in mobile communications and sensor devices in recent years, and thereby the demand for high integration and high performance MMICs is growing. Conventionally, the electronic components in a MMIC, such as transistors, capacitors, resistors, inductors, and transmission lines, are disposed in a two-dimensional manner. To increase the device integration, 3D MMICs with passive components placing over compound semiconductor devices in a three dimensional manner are developed. In compound semiconductor MMICs, Au is commonly used for the passive components and interconnects to prevent cross contamination. However, the high cost of Au limits the thickness of the passive components. For transmission lines, as an example, a Au transmission line used in the 3D MMICs with the width narrower than that used in the conventional MMICs can lead to a higher resistance, leading to signal loss and excess noise. The circuit performance, such as the power gain and the noise figure in a power amplifier, is degraded due to the increased resistance of transmission lines. To improve the circuit performance, the thickness of Au layer must be increased, which in turn significantly increases the overall manufacturing cost. The circuit performance using Au metal layers is therefore restricted by the price of Au. The price of Cu is much lower comparing with Au, and the electrical and the thermal conductivity of Cu is also much better. Therefore, it is preferred to develop 3D MMIC structure in which Au is replaced by Cu.

SUMMARY OF THE INVENTION

The main object of the present invention is to provide a compound semiconductor integrated circuit, which comprises multiple metal layers, each of which comprises at least one copper layer. The multiple metal layers can be used to form passive electronic components three-dimensionally formed over other devices. Using copper in a compound semiconductor integrated circuit can improve the conductivity and reduce the material cost. Furthermore, the low cost of copper makes it practical to produce thicker metal layers which greatly reduce the resistance of the metal layers.

To reach the objects stated above, the present invention provides a compound semiconductor integrated circuit comprising a substrate, at least one compound semiconductor electronic device, a first metal layer, a protection layer, a plurality of second metal layers, and at least one dielectric layer. The first metal layer contains Au but does not contain Cu, and is at least partly electrically connected to the compound semiconductor electronic device. The protection layer covers the compound semiconductor electronic device and at least part of the first metal layer described above. Each of the plurality of second metal layers contains at least a Cu layer, and at least one of the plurality of second metal layers is partly electrically connected to the first metal layer. Each pair of adjacent second metal layers is separated by a dielectric layer.

Another object of the present invention is to provide a compound semiconductor integrated circuit, which comprises multiple metal layers, each of which comprises at least one copper layer, and a backside metal layer used for the ground connection of the electronic devices through a through substrate via hole. The ground connection thereof can thus be made in the vicinity of the devices, which improves the power gain of the electronic devices.

To reach the objects stated above, the compound semiconductor integrated circuit provided by the present invention further includes a backside metal layer, and said substrate further includes at least one through substrate via hole, wherein said through substrate via hole is penetrating said substrate, and said backside metal layer is covering the interior surface of said through substrate via hole and at least part of the backside of said substrate.

In implementation, the substrate described above is made of GaAs, SiC, or sapphire.

In implementation, the compound semiconductor electronic device described above is an FET or an HBT.

In implementation, the compound semiconductor electronic device described above is a GaN FET.

In implementation, the thickness of the Cu layer described above is thicker than or equal to 3 μm.

In implementation, the plurality of second metal layers described above forms at least one ground plane.

In implementation, the dielectric layer described above is made of PBO (Polybenzoxazole) dielectric material.

In implementation, the thickness of the dielectric layer made of PBO described above is thicker than or equal to 10 μm and less than or equal to 30 μm.

In implementation, the protection layer described above is made of SiN.

In implementation, the second metal layers described above form a microstrip line, a coupler, or an inductor.

In implementation, the backside metal layer described above is made at least partly of Cu.

The present invention will be understood more fully by reference to the detailed description of the drawings and the preferred embodiments below.

DETAILED DESCRIPTIONS OF PREFERRED EMBODIMENTS

Figure 1:
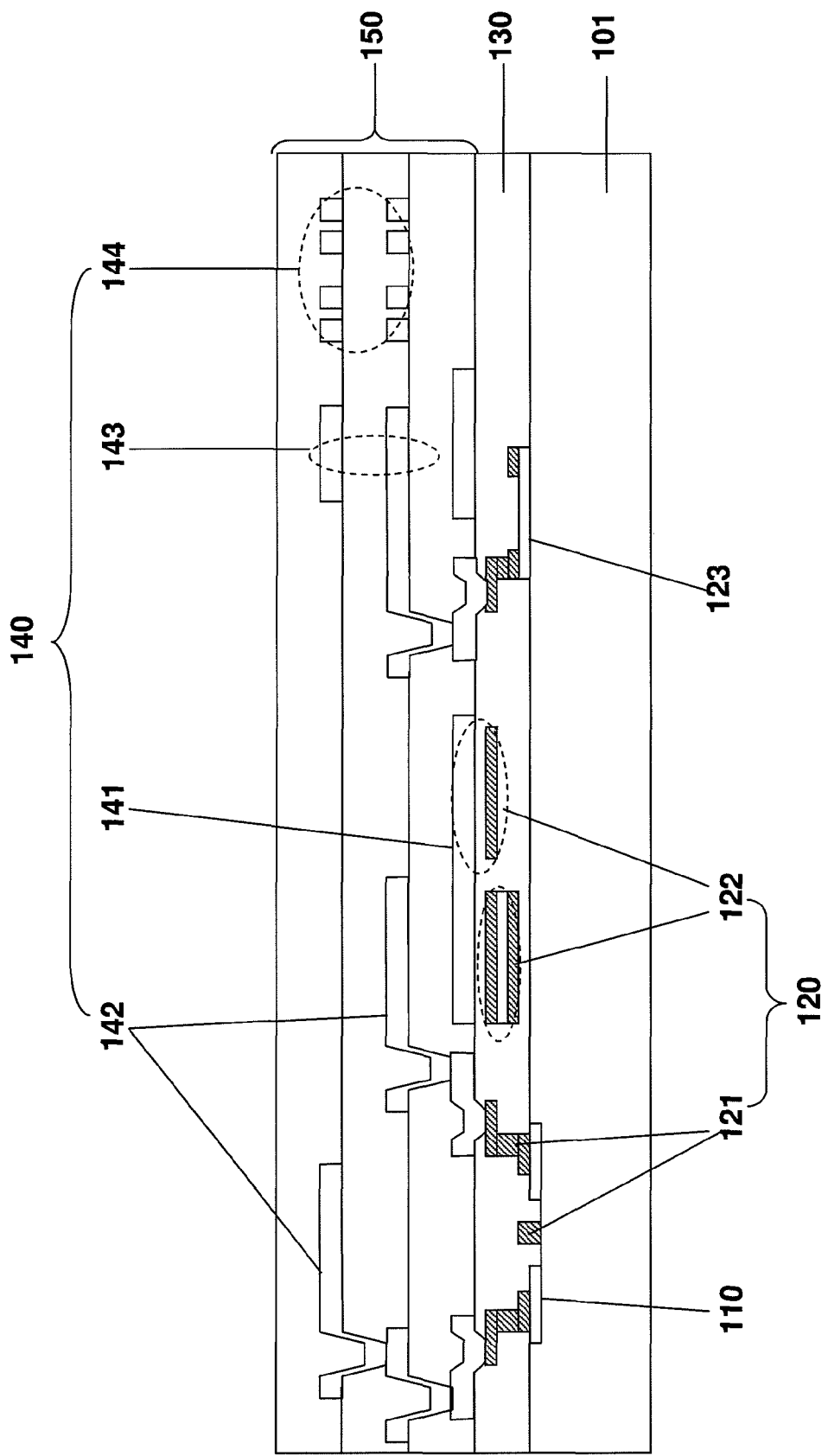
FIG. 1 is a schematic showing the cross-sectional view of an embodiment of the present invention

FIG. 1 is a schematic showing the cross-sectional view of an embodiment of a compound semiconductor integrated circuit according to the present invention, which comprises a substrate 101, at least one compound semiconductor electronic device 110, a first metal layer 120, a protection layer 130, a plurality of second metal layers 140, and at least one dielectric layer 150. The substrate 101 is made of semi-insulating or insulating material such as GaAs, SiC, or sapphire. The compound semiconductor electronic device 110 is formed on the substrate 101. The compound semiconductor electronic device 110 can be an FET or an HBT made mainly of GaAs. The compound semiconductor electronic device 110 can also be a GaN FET. The first metal layer 120 is formed on the compound semiconductor electronic device 110 and is at least partly electrically connected to the compound semiconductor electronic device 110. The first metal layer 120 can be used to form passive electronic components such as electrodes 121 of the compound semiconductor electronic device 110, capacitors 122, or resistors 123. The first metal layer 120 contains Au, and the contact regions of the first metal layer 120 to the compound semiconductor electronic device 110 are made of Au or Au with a thin adhesive metal such as Ti under Au to protect the electronic device from contamination of other materials. The protection layer 130 covers the compound semiconductor electronic device 110 and at least part of the first metal layer 120 to isolate the electronic device 110 from other material layers above, particularly the plurality of the second metal layers 140 containing Cu. The protection layer 130 is made preferably of SiN. At least one of the plurality of second metal layers 140 is partly electrically connected to the first metal layer 120, and each of the plurality of second metal layers 140 includes at least a Cu layer. The thickness of the Cu layer in the second metal layers 140 can be thicker than or equal to 3 μm. The second metal layers 140 are used to form at least one ground plane 141, and other passive electronic components, such as microstrip lines 142, couplers 143, or inductors 144. Any two of adjacent second metal layers 120 are separated by a dielectric layers 150. The thickness of the dielectric layer 150 should be thick enough to provide sufficient isolation between the electronic devices 110 and the metal layers, so that the impacts of the capacitive and inductive coupling on the device performance can be mitigated. The coating thickness of the PBO (Polybenzoxazole) dielectric material can reach a thicker thickness even after curing. Besides, the humidity resistance and the film stress resistance of PBO are better than typical dielectric material such as polyimide and BCB. The dielectric layer 150 is made preferably of PBO (Polybenzoxazole) dielectric material and the preferable thickness between each metal layers 140 is ranging from 10 to 30 μm.

Figure 2:
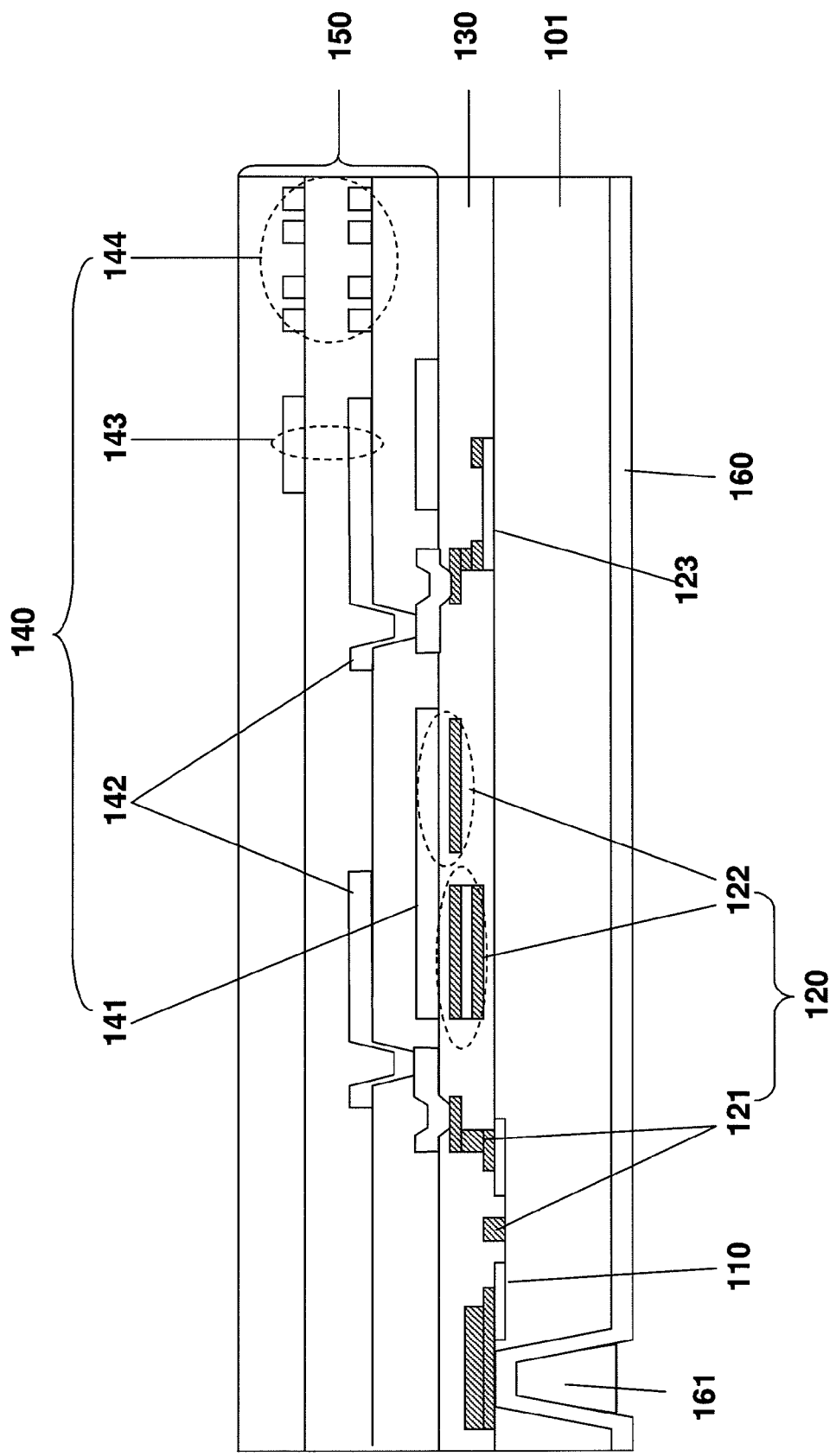
FIG. 2 is a schematic showing the cross-sectional view of another embodiment of the present invention.

FIG. 2 is a schematic showing the cross-sectional view of another embodiment of a compound semiconductor integrated circuit according to the present invention, which further includes a backside metal layer 160 and at least one through substrate via hole 161 in the structure shown in FIG. 1. The through substrate via hole 161 penetrates the substrate 101. The backside metal layer 160 covers the interior surface of the through substrate via hole 161 and at least part of the backside of the substrate 101. The backside metal layer 160 is preferably made at least partly of Cu for the better electrical conductivity and the lower material cost. In this embodiment, the backside metal layer 160 can be used as the ground connection of the electronic devices connected through the through substrate via hole 161.

Figure 3:
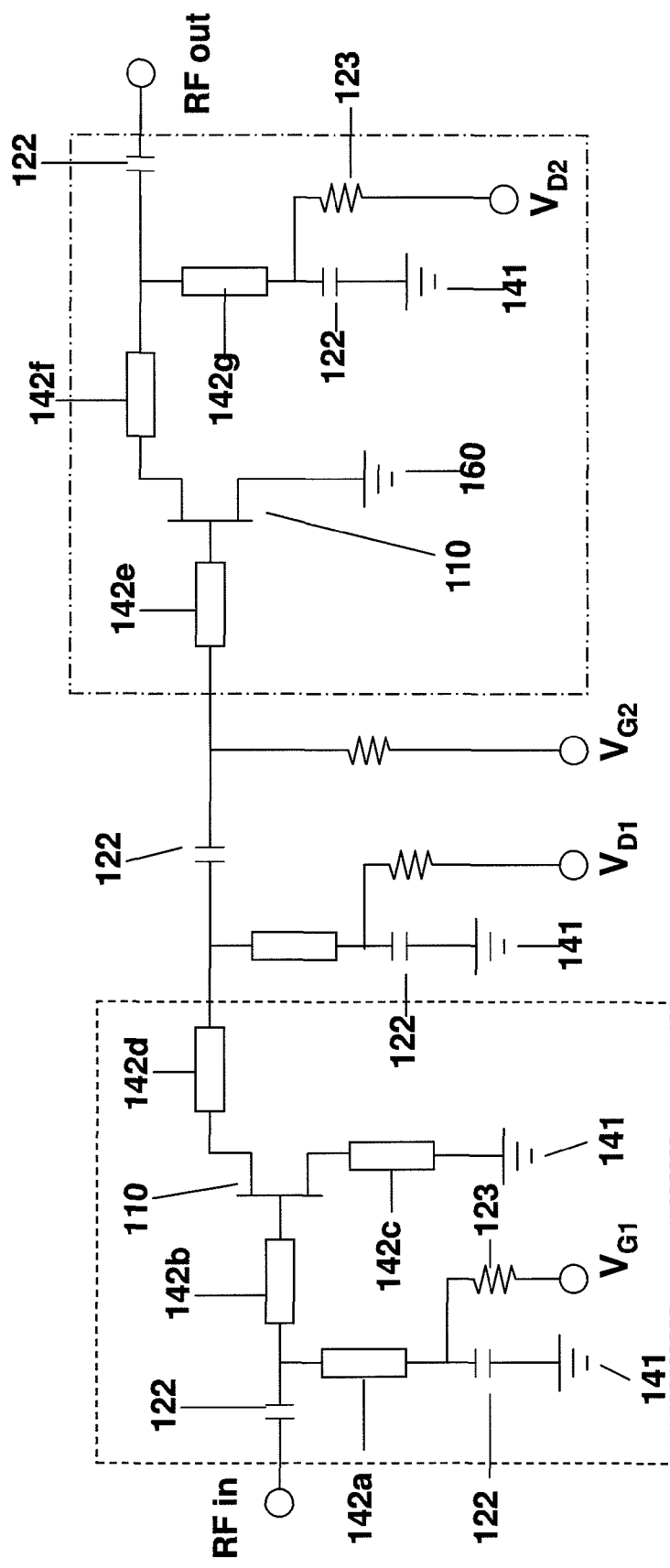
FIG. 3 is a circuit diagram of a low noise amplifier provided by the present invention.
Figure 4A:
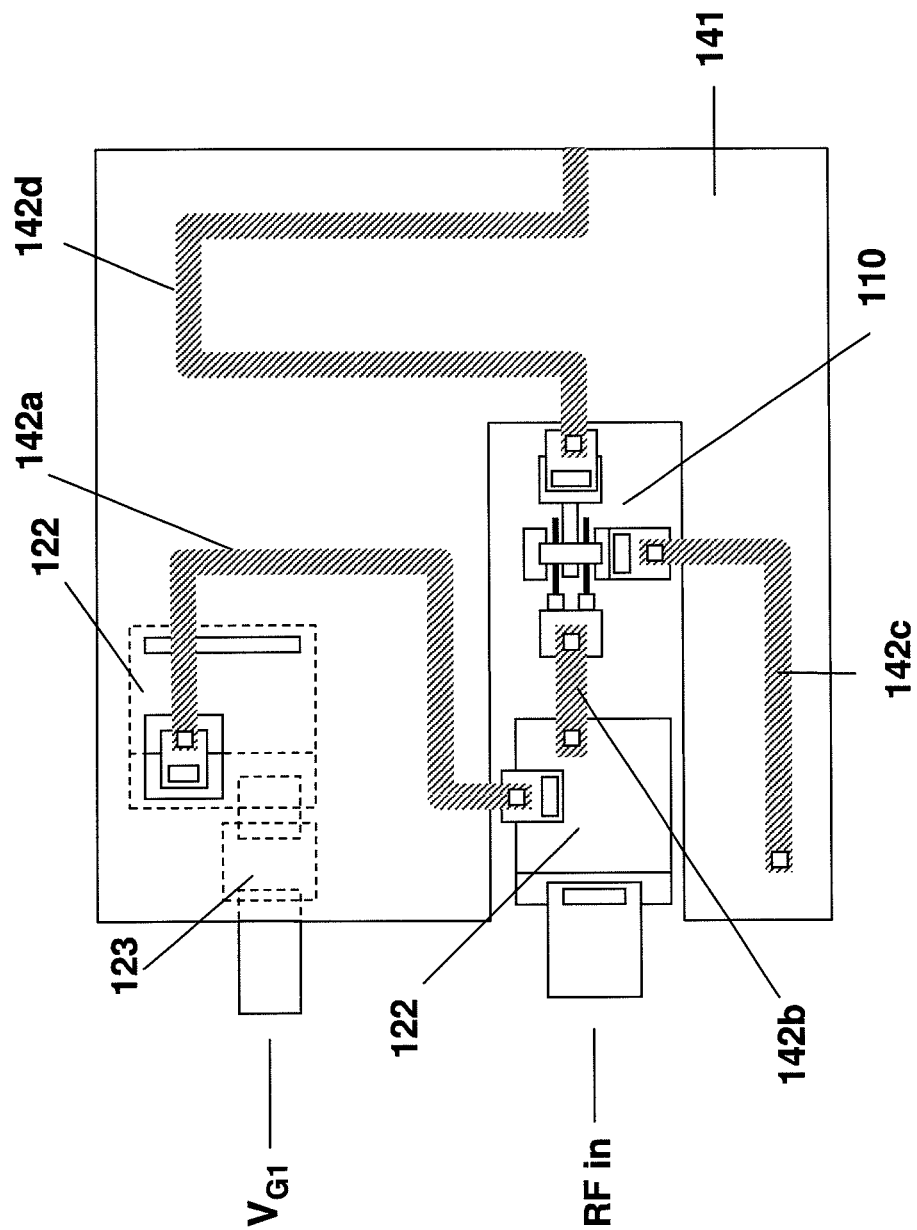
FIGS. 4A and 4B are schematics showing the top view of the layout of the low noise amplifier shown in FIG. 3.
Figure 4B:
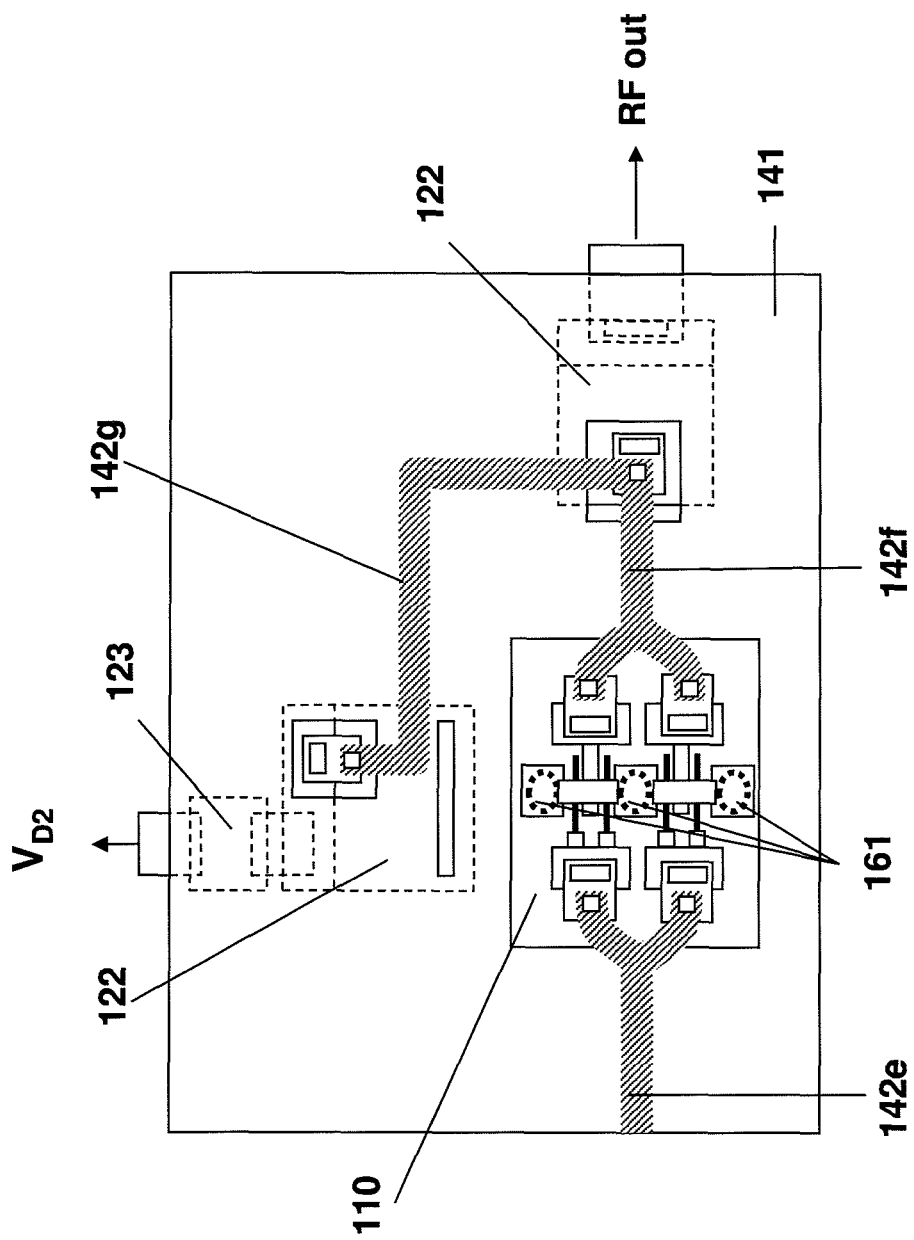

FIG. 3 is a circuit diagram of a two-stage low noise amplifier provided by the present invention. The circuit includes two active electronic devices 110, microstrip lines 142a to 142g, capacitors 122, resistors 123, an RF in, an RF out, ground plane 141, and backside metal layer 160 used for ground connection. The electronic devices are 0.15 μm gate pHEMT. The microstrip lines are used for the impedance and noise matching, and the DC biasing. FIGS. 4A and 4B are schematics showing the top view of the layouts of the low noise amplifier circuit in the dashed square and the dashed-dotted square shown in FIG. 3. FIG. 4A shows the top view of the layout of the first stage (dashed square) of the amplifier. Microstrip line 142a is a short stub for biasing the gate electrode of the pHEMT. Microstrip line 142b and 142c are used to obtain the noise matching. Microstrip line 142d is used to obtain the impedance matching at the output of the pHEMT. Microstrip lines 142a, 142c, and 142d are formed over the ground plane 141. The dense layout of the microstrip lines in a small area is thus achieved. FIG. 4B shows the top view of the layout of the second stage (dashed-dotted square) of the amplifier. Microstrip lines 142e and 142f are used to obtain the impedance matching at the input and output respectively of the pHEMT. Microstrip line 142g is a short stub for biasing the drain of the pHEMT. Again, these microstrip lines are formed over the ground plane enabling the dense layout in a small area. The pHEMT uses the through substrate via hole 161 that facilitates the formation of source ground connection on the backside metal layer 160 in the vicinity of the electronic device. The distance between the ground plane 141 and the microstrip lines in the embodiment is about 10 μm. The Cu layer thickness of the ground plane and the microstrip lines are about 3 μm and the width of the microstrip line is about 15 μm. In that case, the spacing between the two adjacent microstrip lines can be made as small as 30 μm. The metal sheet resistance is reduced by a factor of 2 for a 3 μm Cu layer comparing with a 2 μm Au layer. In a conventional design using Au microstrip lines, the low noise amplifier has a gain of 15 dB with a noise figure of 3.0 dB. In the low noise amplifier using Cu microstrip lines provided by the present invention, the improvement in the noise figure is over 1 dB comparing with the conventional design.

To sum up, the present invention can indeed get its anticipated object to provide a compound semiconductor integrated circuit, which comprises multiple metal layers, each of which comprises at least one copper layer. The present invention has the following advantages:

1. The thick Cu layers provided by the present invention can lower the resistance of narrow microstrip lines made of Au in previous technologies. The excess loss and excess noise induced by the higher resistance can be reduced, and the high conductivity of Cu further improves other performances of the integrated circuit.
2. The manufacturing cost for forming metal planes are significantly reduced by using Cu, typically over 50% comparing with using Au.
3. By using Au for the electrical connection to the compound semiconductor devices, the degradation of their performance due to contamination by Cu is prevented.
4. By using PBO dielectric layer to protect compound semiconductor electronic devices, the Cu cross contamination can be prevented, and the humidity resistance and mechanical stability can also be improved.
5. Using the through substrate via hole for the ground connection of the electronic devices makes it possible to form the ground connection in the vicinity of the device, which can enhance the power gain of the electronic devices.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:
1. A compound semiconductor integrated circuit, comprising:
a substrate;
at least one compound semiconductor electronic device formed on said substrate;

a first metal layer containing Au formed on said compound semiconductor electronic device, and at least partly electrically connected to said compound semiconductor electronic device;

a protection layer covering said compound semiconductor electronic device and at least part of said first metal layer;

a plurality of second metal layers, each including at least a Cu layer, formed on said protection layer, at least two of said plurality of second metal layers stacked vertically and overlapped with each other, and at least one of said plurality of second metal layers partly electrically connected to said first metal layer; and at least one dielectric layer separating each pair of adjacent second metal layers stacked vertically, wherein said protection layer is made of SiN, and all of metal layers composed mainly of Cu on the same side of said substrate that said at least one compound semiconductor electronic device is formed are formed above said protection layer.

2. The compound semiconductor integrated circuit of claim 1, wherein said substrate is made of GaAs, SiC, or sapphire.

3. The compound semiconductor integrated circuit of claim 1, wherein said compound semiconductor electronic device is an FET or an HBT.

4. The compound semiconductor integrated circuit of claim 1, wherein said compound semiconductor electronic device is a GaN FET.

5. The compound semiconductor integrated circuit of claim 1, wherein the thickness of Cu is thicker than or equal to 3 μm.

6. The compound semiconductor integrated circuit of claim 1, wherein said plurality of second metal layers form at least one ground plane.

7. The compound semiconductor integrated circuit of claim 1, wherein said dielectric layer is made of PBO (Polybenzoxazole) dielectric material.

8. The compound semiconductor integrated circuit of claim 7, wherein the thickness of said dielectric layer is ranging from 10 μm to 30 μm.

9. The compound semiconductor integrated circuit of claim 1, wherein said second metal layers form a microstrip line, a coupler, or an inductor.

10. The compound semiconductor integrated circuit of claim 1 further including at least one through substrate via hole penetrating said substrate, and a backside metal layer covering the interior surface of said through substrate via hole and at least part of the backside of said substrate, wherein said substrate is made of GaAs, SiC, or sapphire.

11. The compound semiconductor integrated circuit of claim 10, wherein said backside metal layer is made at least partly of Cu.

12. The compound semiconductor integrated circuit of claim 10, wherein said compound semiconductor electronic device is an FET or an HBT.

13. The compound semiconductor integrated circuit of claim 10, wherein said compound semiconductor electronic device is a GaN FET.

14. The compound semiconductor integrated circuit of claim 10, wherein the thickness of Cu is thicker than or equal to 3 μm.

15. The compound semiconductor integrated circuit of claim 10, wherein said dielectric layer is made of PBO (Polybenzoxazole) dielectric material.

16. The compound semiconductor integrated circuit of claim 15, wherein the thickness of said dielectric layer is ranging from 10 μm to 30 μm.

17. The compound semiconductor integrated circuit of claim 1, wherein said second metal layers form a microstrip line, a coupler, or an inductor.

* * * * *